United States Patent [19]

Brand et al.

[11] 3,711,753

[45] Jan. 16, 1973

[54] ENHANCEMENT MODE N-CHANNEL MOS STRUCTURE AND METHOD

[75] Inventors: Warren L. Brand, Cupertino; Faraj Y. Kashkooli, San Jose, both of Calif.

[73] Assignee: Signetics Corporation, Sunnyvale, Calif.

[22] Filed: June 4, 1971

[21] Appl. No.: 149,944

[52] U.S. Cl..........317/235 R, 317/235 B, 317/235 G
[51] Int. Cl...............................................H01l 11/14
[58] Field of Search.......................317/235 B, 235 G

[56] References Cited

UNITED STATES PATENTS 3,470,390 9/1969 Lin.....................................307/237

OTHER PUBLICATIONS

Faggin, F., Solid State Electronics, Aug. 1970, Vol. 13, pp. 1125–1130, 1143.

Faggin, F., I.E.E.E. Transactions on Electron Devices, Feb. 1969, page 236.

*Primary Examiner*—Martin H. Edlow
*Attorney*—Flehr, Hohbach, Test, Albritton & Herbert

[57] ABSTRACT

Enhancement mode N-channel MOS structure having a semiconductor body with a region of P conductivity type formed in the body and extending to the surface. A polycrystalline gate structure is formed on said surface. Spaced source and drain regions are formed in the region of P conductivity type and form a channel in said body underlying said gate structure with the polycrystalline material of the gate structure having an N-type impurity therein. A layer of insulating material is formed on the surface and covers the gate structure. Contact elements are formed on the layer of insulating material and extend therethrough to make contact with the source and drain regions and said polycrystalline gate structure to form an active device.

In the method for fabricating the structure, the polycrystalline material of the polycrystalline gate structure is doped independently of doping for forming the channel underlying the polycrystalline gate structure.

4 Claims, 10 Drawing Figures

INVENTORS
Warren L. Brand
BY Faraj Y. Kashkooli
Flehr, Hohbach, Test, Albritton & Herbert
Attorneys

ENHANCEMENT MODE N-CHANNEL MOS STRUCTURE AND METHOD

BACKGROUND OF THE INVENTION

1. Field of Invention

This invention relates to an enhancement mode N-channel MOS structure and method and more particularly to such a structure and method utilizing a polycrystalline gate and high resistivity silicon.

2. Description of Prior Art

Enhancement mode N-channel MOS devices have heretofore been made. However, they have utilized a low resistivity silicon to obtain the enhancement mode of operation. This, however, has the disadvantage in that the low resistivity silicon reduces mobility of the electrons and the gain of the device which is formed. In the past, when high resistivity silicon was used, a depletion mode of operation would occur rather than enhancement mode of operation. There is, therefore, a need for a new and improved enhancement mode N-channel MOS structure and method for making the same.

Summary of the Invention and Objects

The enhancement mode N-channel MOS structure consists of a semiconductor body formed of silicon having a major surface. The entire semiconductor body can be doped with a P-type impurity or, alternatively, if the semiconductor body is undoped, a first region of P conductivity type can be formed in the body so that it extends to the surface of the body. The P doped body or region has a resistivity ranging from between 15 to 30 ohm cm. A polycrystalline gate structure is formed on said surface. Spaced source and drain regions of N conductivity type are formed in the P-type region and extend to said surface and form therebetween a channel underlying the gate structure. A layer of insulating material overlies said surface and said polycrystalline gate structure and contact elements are carried on said layer of insulating material and extend through said layer of insulating material to make contact with said source and drain regions and said polycrystalline gate structure to form an active device.

In the method for fabricating an enhancement mode N-channel MOS structure, the polycrystalline material forming a part of the polycrystalline gate structure is doped independently of the doping of the source and drain regions which define the channel underlying the gate and can be doped prior to or after the formation of the source and drain regions but preferably is formed prior thereto.

Another object of the invention is to provide an enhancement mode N-channel MOS structure and method in which high resistivity silicon can be used.

Another object of the invention is to provide a structure and method of the above character which makes possible low power and high speed operation.

Another object of the invention is to provide a structure and method of the above character which makes possible increased device densities on a wafer.

Another object of the invention is to provide a structure of the above character which has decreased junction capacitance.

Additional objects and features of the invention will appear from the following description in which the preferred embodiment is set forth in detail in conjunction with the accompanying drawing.

BRIEF DESCRIPTION OF THE DRAWING

FIGS. 1–9 are cross-sectional views in which FIG. 2 is also a partial isometric view showing the steps utilized for fabricating a structure incorporating the present invention.

DESCRIPTION OF THE PREFERRED EMBODIMENT

The fabrication of the enhancement mode N-channel MOS structure is commenced by taking a semiconductor body 16 which can be in the form of a wafer of silicon, preferably having a <100> crystal orientation and having a resistivity ranging from 15 to 30 ohm cm. and preferably a resistivity of 20 ohm cm. An orientation of <111> may be used if desired. The body 16 is provided with a major surface 17 and has a P-type impurity therein. It should be appreciated that, if desired, single crystal silicon could be utilized for the body and then the selected region of the body doped with the P-type impurity so that it extends to the surface 17. A masking layer 18 formed of a suitable material such as silicon dioxide is formed on the surface 17. Typically, this can be thermally grown silicon dioxide grown in a conventional manner to a suitable thickness as, for example, 2000 Angstroms.

Figure 1:
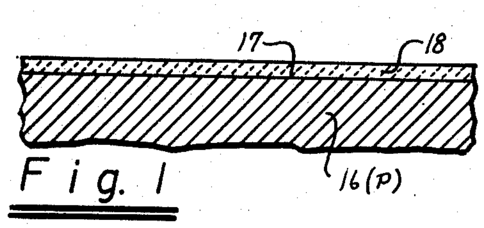
Figure 2:
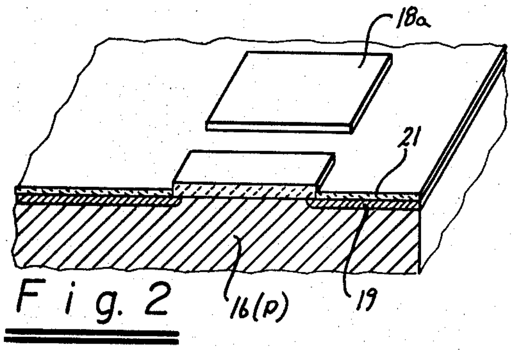
Figure 3:
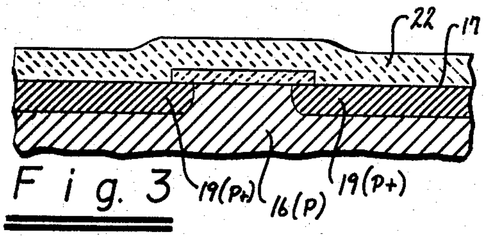
Figure 4:
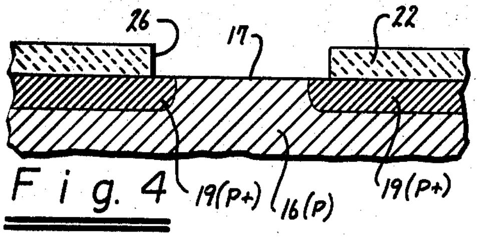

A first mask is then utilized in conjunction with conventional photolithographic techniques for removing a major portion of the masking layer 18 so that there remains a rectangular portion **18*a* as shown in FIG. 2. It should be appreciated that, if desired, the remaining portion 18*a* of the mask can have any desired configuration. After the undesired portions of the masking layer 18 have been removed, the exposed surface 17 has an impurity of one conductivity type, namely, P-type diffused therethrough to dope the field to stop field inversion at the surface 17. Thus, a suitable P-type impurity such as boron is diffused through the surface 17 to form a predeposition region 19 in the field which surrounds the portion 18*a* of the masking layer. At the same time that the boron is being driven in, a very thin layer 21 of silicon dioxide forms on the surface 17 and overlies the region 19**.

After the predeposition step has been carried out, the regions 19 are driven to a greater depth by subjecting the semiconductor body to an elevated temperature so that the regions 19 have a depth of approximately 0.5 micron and preferably within the range of 0.3 to 1.0 micron. During this drive-in process, an insulating layer 22 of silicon dioxide is formed which is grown to a much greater depth as, for example, 5000 – 6000 Angstroms. Thus, the thickness of the layer 22 increases significantly from the approximately 2000 Angstrom thickness of the layer 21.

Figure 5:
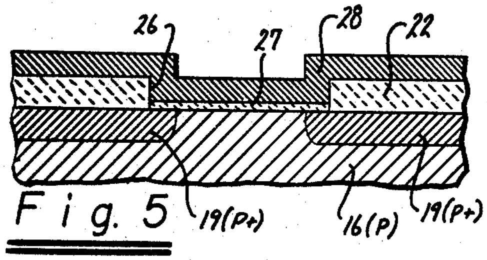
Figure 6:
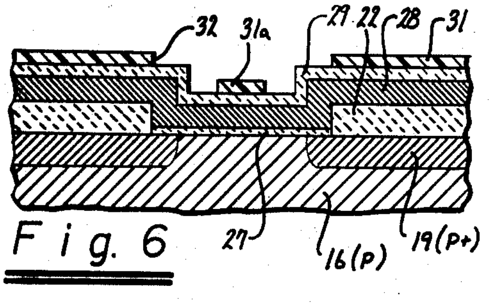

A mask is then utilized to form rectangular elongate openings 26 in the layer 22 which extend to the surface 27 and generally open up the area of the surface 17 which previously was covered by the mask portion **18*a*. These openings 26 will serve to define the combined source, drain and active gate areas for the devices or structures which are to be formed from the body 16. A relatively thin layer 27 of silicon dioxide is then formed on the surface 17 in the openings 26. This layer 27 also can be thermally grown and can have a thickness of approximately 1500 Angstroms but can range from approximately 1200 to 1700 Angstroms. A layer 28 of polycrystalline silicon is then deposited on the layer 22 and in the openings 26 to cover the gate oxide layers 27. The polycrystalline layer 28 can have a suitable thickness as, for example, 5000 Angstroms but can range from 4000 to 7000 Angstroms. During the time that the polycrystalline material is being deposited, a suitable impurity such as a P-type impurity can be utilized for doping the polycrystalline material. For example, an impurity such as boron can be deposited by utilizing boron tribromide ($BBR_3$) which is deposited by the use of a gas in a conventional diffusion furnace at a temperature of approximately 1035° C. As soon as this has been completed, the structure shown in FIG. 5 is dipped in HF and thereafter a layer 29 is formed on the polycrystalline layer 28 which is to be utilized as a mask. Thus, the layer 29** can be formed of deposited silicon dioxide to a suitable thickness as, for example, 1500 – 3000 Angstroms and preferably 2000 Angstroms by the utilization of $CO_2$ and Silane. The formation of such material, conventionally called "Carbox," is deposited at a suitable temperature such as 900° C.

After the layer 29 has been formed, a mask for the gate is provided which is utilized for exposing a layer 31 of photoresist provided on the layer 29. The undesired portions of the photoresist are removed so that there is provided an opening or hole 32 in the photoresist which exposes the oxide layer 29 in the vicinity of the opening 26. In addition, there remains a portion 31*a* of the photoresist which is to cover the gate structure for the device or structure which is to be formed.

An etch is then utilized which selectively attacks the exposed portions of the silicon dioxide layer 29. The remaining portions of the photoresist are then removed. An etch is next utilized which selectively attacks the portions of the polycrystalline layer 28 which had been exposed by etching away the portions of the silicon dioxide layer 29. The portion 28*a* of the polycrystalline layer 28 underlying the portion 29*a* of the silicon dioxide surface is protected from the etch by the mask formed by the portion 29*a*. Thereafter, another etch is utilized which selectively attacks the exposed portions of the gate oxide layer 27 so that the only portion which remains will be the portion 27*a* underlying the polycrystalline portion 28*a*. Thus, it can be seen that the portion 29*a* of the layer 29 serves as a mask to protect the polycrystalline layer and the gate oxide layer which are to be utilized for forming of the gate structure 33. This gate structure 33 is encompassed or by the recess 26 which previously had been formed.

An N+ impurity is then diffused into the opening 34 into the exposed areas of the surface 17 so that the N+ impurity is driven into the surface in regions 36 adjacent the surface 17 in a predeposition step. This can be carried out by utilizing a suitable N-type impurity such as phosphorus oxychloride ($POCl_3$) in a temperature ranging from 850° – 900° C.

Figure 7:
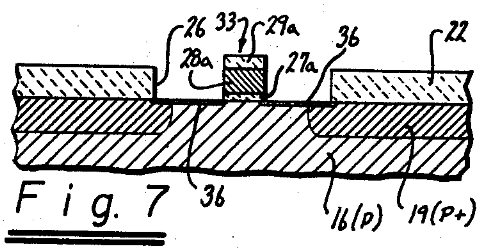
Figure 8:
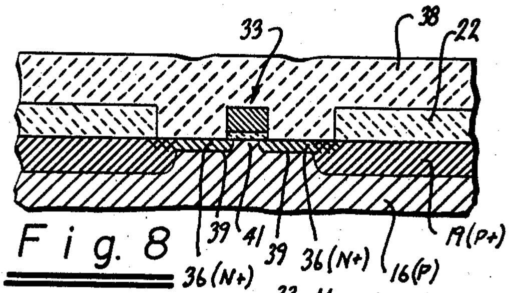
Figure 9:
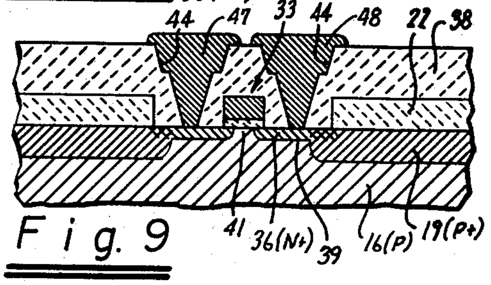

After the predeposition step has been completed, the structure shown in FIG. 7 is dipped in a buffered etch to remove the gate masking oxide layer 29. As soon as this has been accomplished, a relatively thick layer 38 of an insulating material is deposited on the gate structure 33 in the opening 26 to a suitable thickness such as 8000 – 9000 Angstroms. As pointed out previously, this can be accomplished by the deposition of Carbox utilizing $CO_2$ and Silane. The surface of this thick layer 38 is stabilized by introducing phosphorus oxychloride at a temperature of 850° C. Thereafter, the structure is subjected to a temperature of 920° C. in an oxygen and nitrogen atmosphere to anneal the same. After the field oxide layer 38 has been stabilized, the structure is raised to an elevated temperature such as 1070° C. for a suitable period of time such as 30 min. to drive in the regions 36 to a suitable depth as, for example, 1 to 1.2 microns. These two regions 36 are space apart and parallel and are defined by N junctions 39 which extend to the surface beneath the gate oxide layer 27 to define a channel 41 between the same which also underlies the polycrystalline gate structure 33. It will be noted during the drive-in of the regions 36 that the regions 19 will be driven to greater depths and that the outer margins of the regions 36 merge into the regions 19.

Figure 10:
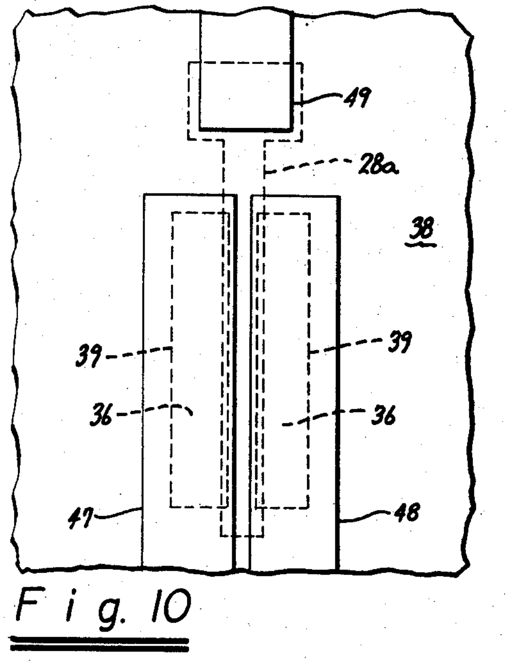
FIG. 10 is a partial plan view of the structure shown in FIG. 9.

Another mask is utilized for forming openings 44 which extend through the thick oxide layer 38 and expose the areas of the surface 17 overlying the regions 36. In addition, there is provided another opening (not shown) which makes access possible to the gate structure out in the field away from the source and drain regions. This type of connection is shown in FIG. 10 and also is described in copending application, Ser. No. 153732, filed June 16, 1791. After the openings have been formed, suitable metallization such as aluminum is deposited on the surface and another mask is utilized in conjunction with conventional photolithographic techniques to remove the undesired portions of the metallization so that there remains a source contact element 47, a drain contact element 48 and a gate contact element 49. The aluminum can have a suitable thickness such as 1.6 microns. After the aluminum has been etched away as shown in FIG. 10, the structure can be subjected to an alloying operation as, for example, a temperature of 450° C. The wafer can then be scribed and tested and broken apart to provide a plurality of the MOS structures.

Thus, by way of example, a structure incorporating the present invention had a semiconductor body with a resistivity of 20 – 30 ohm cm. P-type material. It had an N+ junction depth of 1 micron and a P+ junction depth of 1 micron for the field area. The gate oxide had a thickness of 1500 Angstroms and the polycrystalline silicon deposited on the gate oxide had a thickness of 7000 Angstroms. The total oxide field thickness was approximately 1.3 microns and the aluminum which was utilized for the contact elements or leads had a thickness of 1.5 microns.

In operation of the structure, it was found that it readily operated in the enhancement mode even though a high resistivity silicon was utilized as the substrate or semiconductor body. The placement of additional P-type impurities in the semiconductor body adjacent the surface 17 minimized or avoided parasitic field inversion at the surface 17.

The principles of operation of the MOS structure are similar to previous devices in that it would operate in the enhancement mode, that is, it would not conduct with no voltage applied to the gate. As soon as a positive voltage is applied to the gate, the device is on and will conduct in two regions, the source and drain. Since a high resistivity material is utilized, the effective mobility is approximately 500 – 600. The field turn-on voltage is approximately 25 – 30 volts. The breakdown voltage would also be approximately 25 – 30 volts. The junction capacitance is significantly less. This is at least in part due to the fact that the aluminum which is utilized for making the contact elements makes a better contact to areas having N-type impurities therein than it does with areas having P-type impurities therein.

Thus, since the structure is of the N-channel type, it operates with positive voltages and can be interfaced directly with other devices such as bipolar devices. P-channel devices operate with negative voltages and for that reason the voltage must be inverted before they can be interfaced.

The higher mobility of the N-type MOS structures of the present invention is advantageous in several ways. For example, it is possible to build N-channel type structures of the same size as P-channel MOS structures. Thus, higher densities of N-channel type devices can be obtained. Also, with the N-channel type MOS structures of the present invention, it is possible to operate at lower voltages and at lower power requirements than the P-channel type MOS structures. In summary, the N-channel MOS structures have higher gain and less source-substrate bias effect than conventional N-channel MOS structures which achieve enhancement mode operation by the use of low resistivity substrates. The P+ doped polysilicon gate N-channel type MOS structures permit the fabrication of low power, high speed and high density MOS circuits without additional power supplies for enhancement operation.

We claim:

1. In an enhancement mode N-channel type MOS structure, a semiconductor body of silicon having a major surface, a first region of P conductivity type formed in said body and extending to the surface, said region having a resistivity ranging from 15 to 30 ohm cm., a polycrystalline gate structure disposed on said surface, a pair of spaced source and drain regions formed in said body and extending to said surface, said source and drain regions forming a channel in said body underlying said gate structure, said source and drain regions being of N conductivity type, said gate having polycrystalline material with a P-type impurity therein, a layer of insulating material on said surface and covering said gate structure, and contact elements on said surface extending through said layer of insulating material and making contact with said source and drain regions and said polycrystalline gate structure to form an active device.

2. A structure as in claim 1 wherein said semiconductor body is provided with a region surrounding said source and drain regions and having a P-type impurity therein of a greater concentration than the concentration of the P-type impurity in the semiconductor body.

3. A structure as in claim 2 wherein said source and drain regions contact said region surrounding said source and drain regions.

4. A structure as in claim 1 wherein said polycrystalline gate structure includes a layer of silicon dioxide disposed on said surface, and a polycrystalline layer disposed on said silicon oxide surface.

* * * * *